(12) United States Patent (10) Patent No.: US 12,345,660 B2
Shiga et al. (45) Date of Patent: Jul. 1, 2025

(54) METHOD FOR EVALUATING CRYSTAL DEFECTS IN SILICON CARBIDE SINGLE CRYSTAL WAFER

(71) Applicant: SHIN-ETSU HANDOTAI CO., LTD., Tokyo (JP)

(72) Inventors: Yutaka Shiga, Annaka (JP); Toru Takahashi, Annaka (JP); Hisao Muraki, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 143 days.

(21) Appl. No.: 18/280,825

(22) PCT Filed: Feb. 25, 2022

(86) PCT No.: PCT/JP2022/007910
§ 371 (c)(1),
(2) Date: Sep. 7, 2023

(87) PCT Pub. No.: WO2022/196292
PCT Pub. Date: Sep. 22, 2022

(65) Prior Publication Data
US 2024/0142390 A1 May 2, 2024

(30) Foreign Application Priority Data
Mar. 16, 2021 (JP) ................. 2021-042104

(51) Int. Cl.
*G01N 21/95* (2006.01)
*C30B 29/36* (2006.01)
(Continued)

(52) U.S. Cl.
CPC ......... *G01N 21/9505* (2013.01); *C30B 29/36* (2013.01); *C30B 33/10* (2013.01); *H01L 22/12* (2013.01)

(58) Field of Classification Search
CPC ............... G01N 21/95; G01N 21/9501; G01N 21/9503; G01N 21/9505; G01N 21/956;
(Continued)

(56) References Cited

U.S. PATENT DOCUMENTS 5,958,132 A * 9/1999 Takahashi ............... C30B 29/36
117/109
7,279,115 B1 * 10/2007 Sumakeris .......... H01L 21/3065
438/692
(Continued)

FOREIGN PATENT DOCUMENTS

JP S60-55612 A 3/1985
JP 2008-115036 A 5/2008
(Continued)

OTHER PUBLICATIONS

Apr. 26, 2022 International Search Report issued in International Patent Application No. PCT/JP2022/007910.
(Continued)

*Primary Examiner* — John R Lee
(74) *Attorney, Agent, or Firm* — Oliff PLC

(57) ABSTRACT

A method for evaluating crystal defects in a silicon carbide single crystal wafer, the method including steps of: etching a silicon carbide single crystal wafer with melted KOH so that a size of an etch pit due to a threading edge dislocation is 10 to 50 μm; obtaining microscopic images by automatic photographing at a plurality of positions on a surface of the silicon carbide single crystal wafer after the etching; determining presence or absence of a defect dense part in each of all the obtained microscopic images based on a continued length of the etch pit formed by the etching; and classifying all the obtained microscopic images into microscopic images having the defect dense part and microscopic images
(Continued)

not having the defect dense part to evaluate a dense state of crystal defects in the silicon carbide single crystal wafer.

17 Claims, 3 Drawing Sheets

(51) Int. Cl.
  *C30B 33/10* (2006.01)
  *H01L 21/66* (2006.01)
(58) Field of Classification Search
  CPC ......... C30B 29/36; C30B 33/10; H01L 22/12; H01L 22/10; H01L 22/00
  See application file for complete search history.

(56) References Cited

U.S. PATENT DOCUMENTS

| | | | | |
|---|---|---|---|---|
| 7,601,986 | B2* | 10/2009 | Hallin | C30B 29/36 |
| | | | | 438/105 |
| 8,293,623 | B2* | 10/2012 | Momose | C23C 16/325 |
| | | | | 438/413 |
| 8,716,718 | B2* | 5/2014 | Momose | H01L 21/02529 |
| | | | | 257/77 |
| 9,234,297 | B2* | 1/2016 | Sato | C30B 23/02 |
| 9,287,121 | B2* | 3/2016 | Momose | H01L 21/0262 |
| 9,644,287 | B2* | 5/2017 | Sudarshan | H01L 21/0262 |
| 9,738,991 | B2* | 8/2017 | Loboda | C30B 23/025 |
| 9,777,403 | B2* | 10/2017 | Nakabayashi | C30B 29/36 |
| 9,797,064 | B2* | 10/2017 | Loboda | C23C 14/26 |
| 10,202,706 | B2* | 2/2019 | Nakabayashi | H10D 62/53 |
| 10,612,154 | B2* | 4/2020 | Shinya | C30B 19/12 |
| 10,626,520 | B2* | 4/2020 | Aigo | H01L 21/02433 |
| 11,078,596 | B2* | 8/2021 | Nakabayashi | G01N 23/207 |
| 11,932,967 | B2* | 3/2024 | Kaneko | C30B 29/36 |
| 12,071,709 | B2* | 8/2024 | Kamata | C30B 25/02 |
| 12,098,476 | B2* | 9/2024 | Kaneko | H01L 21/02579 |
| 12,247,319 | B2* | 3/2025 | Kaneko | C30B 23/063 |
| 2005/0205871 | A1* | 9/2005 | Hallin | C30B 25/02 |
| | | | | 257/77 |
| 2012/0016630 | A1 | 1/2012 | Shintani et al. | |
| 2013/0029158 | A1* | 1/2013 | Aigo | C30B 25/10 |
| | | | | 117/89 |
| 2016/0190020 | A1* | 6/2016 | Kimura | G01R 31/265 |
| | | | | 324/754.21 |
| 2017/0335489 | A1 | 11/2017 | Honke et al. | |
| 2018/0363166 | A1 | 12/2018 | Wada et al. | |
| 2019/0194818 | A1* | 6/2019 | Igi | C30B 23/063 |
| 2020/0056302 | A1* | 2/2020 | Balachandran | H01L 21/02658 |
| 2024/0142390 | A1* | 5/2024 | Shiga | C30B 29/36 |
| 2024/0145229 | A1* | 5/2024 | Okita | C30B 33/08 |

FOREIGN PATENT DOCUMENTS

| | | |
|---|---|---|
| JP | 2010-223812 A | 10/2010 |
| JP | 2011-027427 A | 2/2011 |
| JP | 2011-151317 A | 8/2011 |
| JP | 2015-188003 A | 10/2015 |
| JP | 2017-145150 A | 8/2017 |
| JP | 2018-131350 A | 8/2018 |
| WO | 2016/084561 A1 | 6/2016 |

OTHER PUBLICATIONS

Sep. 12, 2023 International Preliminary Report on Patentability issued in International Patent Application No. PCT/JP2022/007910.

* cited by examiner

[FIG. 1]
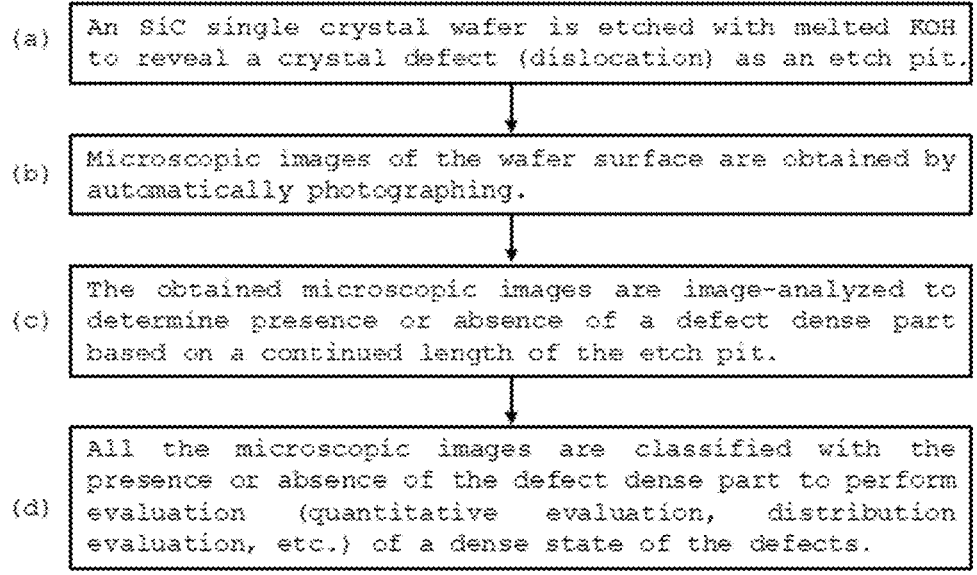
[FIG. 2]
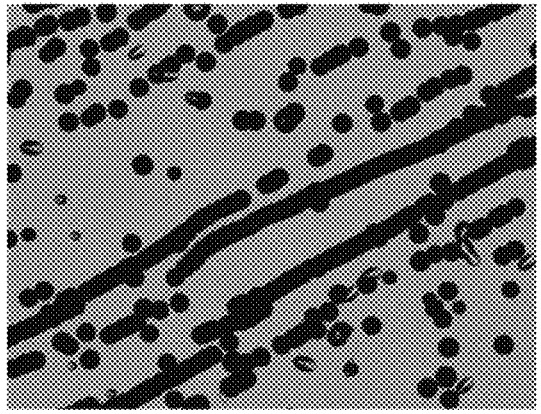
[FIG. 3]
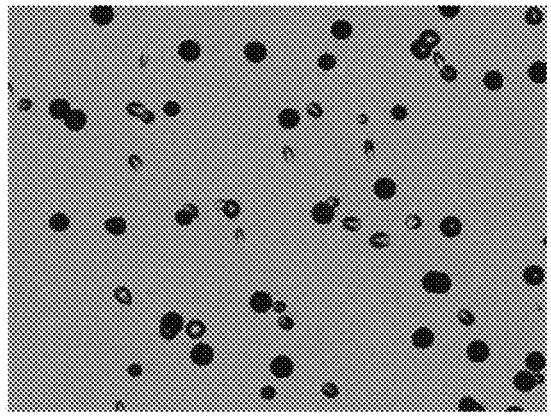

[FIG. 4]
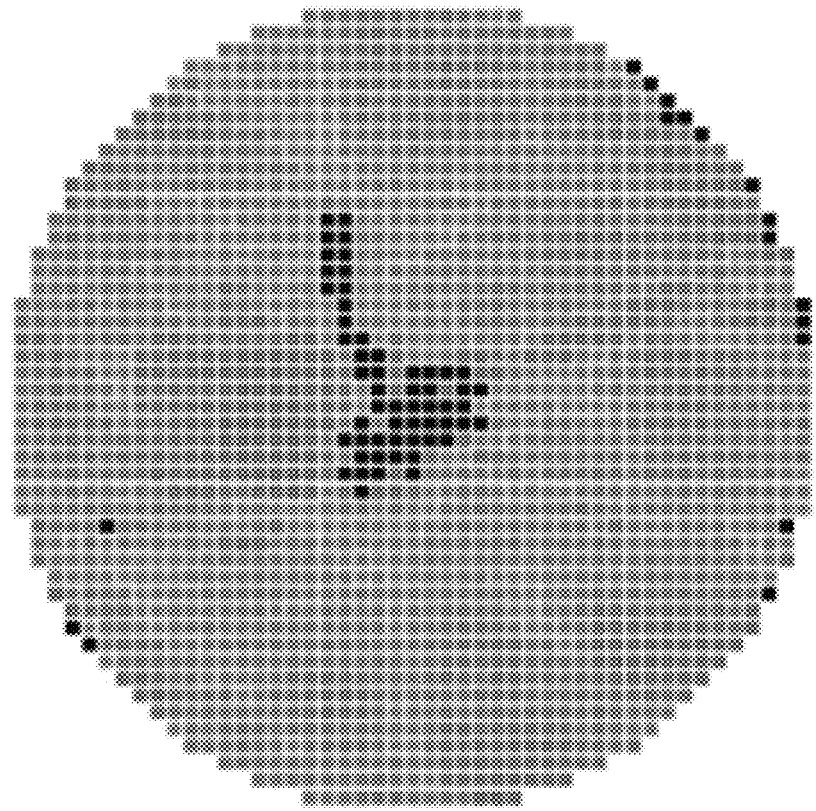
[FIG. 5]
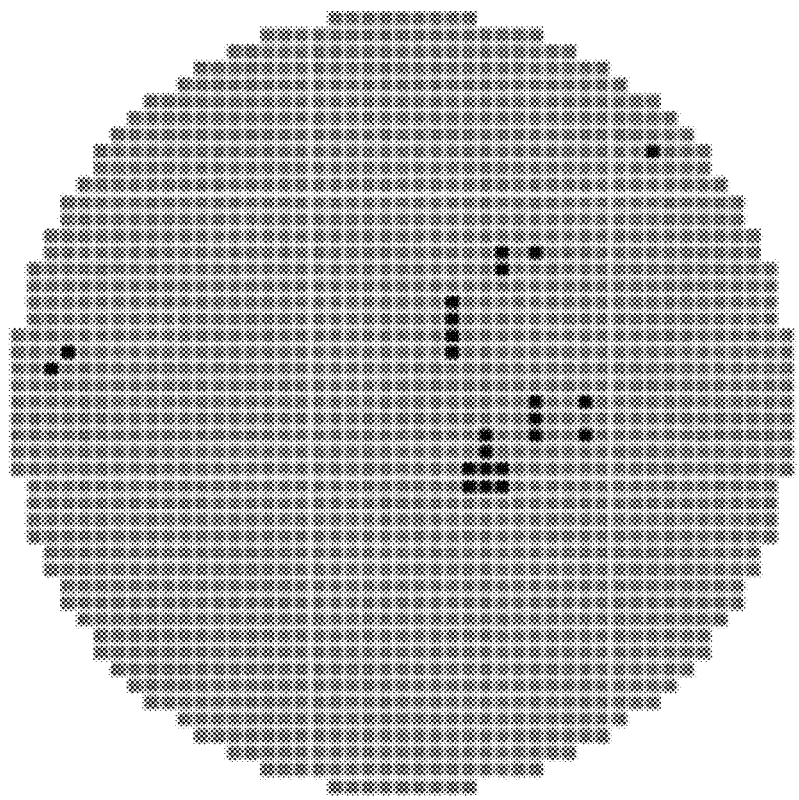

[FIG. 6]
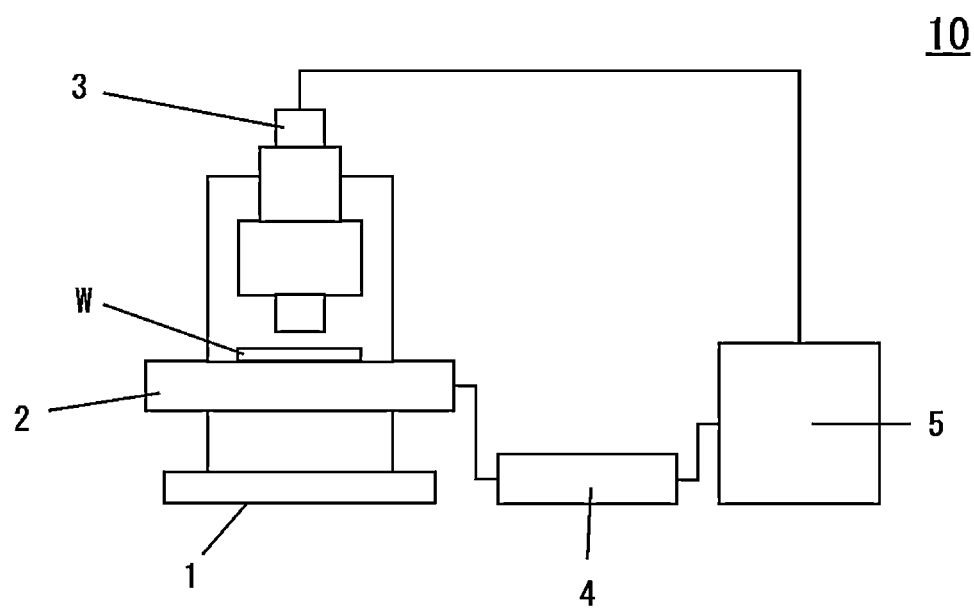

METHOD FOR EVALUATING CRYSTAL DEFECTS IN SILICON CARBIDE SINGLE CRYSTAL WAFER

TECHNICAL FIELD

The present invention relates to a method for evaluating crystal defects in a silicon carbide single crystal wafer.

BACKGROUND ART

A power device using a silicon carbide (SiC) single crystal wafer has attracted attention in recent years since having features such as high breakdown voltage resistance, low loss, and operability at high temperature.

The silicon carbide (SiC) single crystal wafer contains various crystal defects. Specifically, a micropipe, a threading helical dislocation, a threading edge dislocation, and a basal plane dislocation considerably adversely affect characteristics of electronic devices, and thereby precise evaluation therefor is extremely important for evaluation of substrate performance. In particular, required is a method for easily and simply detecting crystal defect density with high precision in a process for manufacturing a semiconductor substrate. A method for detecting crystal defects in a silicon carbide single crystal is proposed in, for example, Patent Document 1. The method for evaluating dislocation density in the silicon carbide single crystal wafer described in Patent Document 1 evaluates performance by observing the wafer with a microscope. The crystal defects (dislocation) in the wafer are revealed as an etch pit by selective etching using melted alkali.

CITATION LIST

Patent Literature

Patent Document 1: JP 2011-151317 A

SUMMARY OF INVENTION

Technical Problem

However, it is difficult to observe an entire surface of the wafer with the conventional microscope observation, and the observation is limited to local observation. Although a dislocation dense part causes a considerably large adverse effect, it is difficult to quantitatively evaluate a position and distribution of the dislocation dense part in the wafer surface and a degree of the dense part by the conventional local observation.

The present invention has been made to solve the above problem. An object of the present invention is to provide a method for evaluating crystal defects in a silicon carbide single crystal wafer that can easily and simply evaluate the defect dense part of crystal defects, such as micropipes, threading helical dislocations, threading edge dislocations, and basal plane dislocations, in the silicon carbide single crystal wafer surface, specifically that can evaluate a position and distribution of the defect dense part and that can quantitatively evaluate a degree of the defect dense part.

Solution to Problem

The present invention has been made to achieve the above object, and provides a method for evaluating crystal defects in a silicon carbide single crystal wafer, the method comprising steps of: etching a silicon carbide single crystal wafer with melted KOH so that a size of an etch pit due to a threading edge dislocation is 10 to 50 µm; obtaining microscopic images by automatic photographing at a plurality of positions on a surface of the silicon carbide single crystal wafer after the etching; determining presence or absence of a defect dense part in each of all the obtained microscopic images based on a continued length of the etch pit formed by the etching; and classifying all the obtained microscopic images into microscopic images having the defect dense part and microscopic images not having the defect dense part to evaluate a dense state of crystal defects in the silicon carbide single crystal wafer.

Such a method for evaluating crystal defects in a silicon carbide single crystal wafer can easily and simply evaluate a dense state of the crystal defects in the silicon carbide single crystal wafer with high precision by revealing the crystal defects as the etch pit. By further inspecting the defect dense part by using this evaluation results and performing improvement or selection, a good silicon carbide single crystal wafer with reduced dense crystal defects can be provided. As a result, a silicon carbide single crystal wafer with which a device can be manufactured with a high yield can be provided.

In this case, the method can be the method for evaluating crystal defects in a silicon carbide single crystal wafer wherein the microscopic images are judged to have the defect dense part when an etch pit having a continued length of 500 µm or longer is observed.

This method can evaluate the crystal defects in the silicon carbide single crystal wafer more stably and certainly with high precision.

In this case, the method can be the method for evaluating crystal defects in a silicon carbide single crystal wafer wherein the dense state of the crystal defects in the silicon carbide single crystal wafer is evaluated based on a ratio of a number of the microscopic images having the defect dense part to a total number of the obtained microscopic images.

This method enables to easily and quantitatively evaluate a degree of the defect dense part on the silicon carbide single crystal wafer surface with digitalization.

In this case, the method can be the method for evaluating crystal defects in a silicon carbide single crystal wafer wherein an in-plane distribution of the crystal defects in the silicon carbide single crystal wafer is evaluated based on positional information of the microscopic images having the defect dense part and positional information of the microscopic images not having the defect dense part.

This method can grasp the position of the defect dense part on the silicon carbide single crystal wafer surface, and enables to easily evaluate the in-plane distribution.

In this case, the method for evaluating crystal defects in a silicon carbide single crystal wafer can be a method in which the crystal defects are micropipes, threading helical dislocations, threading edge dislocations, and basal plane dislocations.

The method for evaluating crystal defects according to the present invention is suitable for evaluating such crystal defects.

In this case, the method can be the method for evaluating crystal defects in a silicon carbide single crystal wafer wherein the microscopic images are obtained by the automatic photographing by using an automatic inspecting apparatus having at least an electrically-driven XY stage, a microscope, and an imaging camera, and the obtained microscopic images are subjected to image analysis to judge presence or absence of the defect dense part.

This method can stably and easily evaluate the crystal defects in a short time regardless of difference in the skill and proficiency of the measurers, etc.

Advantageous Effects of Invention

As noted above, the inventive method for evaluating crystal defects in the silicon carbide single crystal wafer can easily and simply evaluate the dense state of the crystal defects in the silicon carbide single crystal wafer with high precision by revealing the crystal defects as the etch pit. By further inspecting the defect dense part by using this evaluation result and performing improvement or selection, a good silicon carbide single crystal wafer with reduced dense crystal defects can be provided. As a result, the silicon carbide single crystal wafer that can manufacture a device with a good yield can be provided.

BRIEF DESCRIPTION OF DRAWINGS

FIG. 1 shows a schematic flowchart of the method for evaluating crystal defects in a silicon carbide single crystal wafer according to the present invention.

FIG. 2 shows a microscopic image showing a continued etch pit.

FIG. 3 shows a microscopic image without a continued etch pit.

FIG. 4 shows a mapping of microscopic images in which presence or absence of a defect dense part is classified in Example (wafer with 100 mm in diameter).

FIG. 5 shows a mapping of microscopic images in which presence or absence of a defect dense part is classified in Example (wafer with 96 mm in diameter).

FIG. 6 illustrates an automatic inspecting apparatus suitably used for the method for evaluating crystal defects in a silicon carbide single crystal wafer according to the present invention.

DESCRIPTION OF EMBODIMENTS

Hereinafter, the present invention will be described in detail, but the present invention is not limited thereto.

As noted above, required is a method that can evaluate the position and distribution of a dense part of crystal defects in the silicon carbide single crystal wafer surface, such as a micropipe, a threading helical dislocation, a threading edge dislocation, and a basal plane dislocation, and that can quantitatively evaluate a degree of the dense part.

The present inventors have made earnest study on the above problem, and consequently have found that the dense state of the crystal defects in the silicon carbide single crystal wafer can be easily and simply evaluated with high precision by a method for evaluating crystal defects in a silicon carbide single crystal wafer, the method comprising steps of: etching a silicon carbide single crystal wafer with melted KOH so that a size of an etch pit due to a threading edge dislocation is 10 to 50 μm; obtaining microscopic images by automatic photographing at a plurality of positions on a surface of the silicon carbide single crystal wafer after the etching; determining presence or absence of a defect dense part in each of all the obtained microscopic images based on a continued length of the etch pit formed by the etching; and classifying all the obtained microscopic images into microscopic images having the defect dense part and microscopic images not having the defect dense part to evaluate a dense state of crystal defects in the silicon carbide single crystal wafer. This finding has led to complete the present invention.

Hereinafter, the description will be made with reference to the drawings.

(Automatic Inspecting Apparatus)

First, an automatic inspecting apparatus suitably used for the method for evaluating crystal defects in the silicon carbide single crystal wafer according to the present invention will be described. FIG. 6 illustrates an example of the automatic inspecting apparatus. This automatic inspecting apparatus 10 comprises a microscope 1, an electrically-driven XY stage 2 on which an evaluation (observation) target wafer W is mounted and electrically movable in an XY direction, and an imaging camera 3 such as a digital camera. The automatic inspecting apparatus also comprises a controller 4 to control the apparatus. Furthermore, the automatic inspecting apparatus comprising a personal computer (PC) 5. Equipped with the PC 5, an operator can input measurement conditions and display measurement results on the PC monitor to check and analyze evaluation results.

(Method for Evaluating Crystal Defects)

Next, the method for evaluating crystal defects in a silicon carbide single crystal wafer according to the present invention will be described. FIG. 1 shows a flowchart of the method for evaluating crystal defects in a silicon carbide single crystal wafer according to the present invention.

First, as shown in FIG. 1(a), a measurement target silicon carbide (SiC) single crystal wafer is etched with melted KOH to reveal crystal defects such as dislocation present in the silicon carbide single crystal wafer as a pit. An amount (condition) of the etching in this time is regulated so that a size of the etch pit due to a threading edge dislocation is 10 to 50 μm. Such a melted KOH etching condition can be adjusted by a temperature of the melted KOH, an etching time, etc., and the etching condition is determined in advance prior to the actual crystal evaluation.

Here, the size (10 to 50 μm) of the pit due to a threading edge dislocation is adopted as an index in order to precisely grasp and determine the presence of the etch pit when a microscopic image of a surface of the silicon carbide single crystal wafer is automatically photographed in the next step. That is, there are a larger amount of threading edge dislocations than other dislocations and the etch pit has a circular shape, and thereby the threading edge dislocation is most suitable as an index for setting the etching condition. With etching so that the size of the etch pit due to the threading edge dislocation is smaller than 10 μm, the shape of the etch pit is unclear and may fail to be distinguished from a dust. Meanwhile, with etching so that the size of the etch pit due to the threading edge dislocation is larger than 50 μm, the excessively large pit makes it difficult to precisely evaluate the dense state.

Then, as shown in FIG. 1(b), microscopic images are obtained by automatic photographing at a plurality of positions on a surface of the silicon carbide single crystal wafer. By using the automatic inspecting apparatus described as above, an entire wafer can be photographed with a predetermined interval by controlling the electrically driven XY stage. For example, the microscopic images are preferably automatically photographed with 2-mm interval so that an observation field size is 1 mm square.

Then, presence or absence of a defect dense part is determined in each of all the obtained microscopic images based on a continued length of the etch pit formed by the etching. As shown in FIG. 1(c), the obtained microscopic images are image-analyzed, and a continued etch pit having a length equal to or longer than a predetermined length is judged as the defect dense part, for example. A microscopic image (picture) including such a defect dense part is judged as the presence of the defect dense part.

FIG. 2 shows a microscopic image (observation field: 1.42×1.06 mm) showing a continued etch pit. A microscopic image in which the continued etch pit is observed as FIG. 2 is judged to have the defect dense part. FIG. 3 shows a microscopic image (observation field: 1.42×1.06 mm) without a continued etch pit. A microscopic image as FIG. 3 is judged not to have the defect dense part.

In this time, the microscopic images are preferably judged to have the defect dense part when an etch pit having a continued length of 500 μm or longer is observed. This is because the presence or absence of the defect dense part can be more stably and more highly precisely determined by setting the continued length of the etch pit within such a range as a reference.

The crystal defect of the evaluation target can be a micropipe, a threading helical dislocation, a threading edge dislocation, and a basal plane dislocation. The method for evaluating crystal defects according to the present invention is particularly suitable for evaluating the dense state of such crystal defects.

As shown in FIG. 1(*d*), all the obtained microscopic images are classified into microscopic images having the defect dense part and microscopic images not having the defect dense part. Then, the dense state of the crystal defects in the silicon carbide single crystal wafer is evaluated by using this classification results.

Next, a specific example of the evaluation of the dense state of the crystal defects will be described. For example, the dense state in the silicon carbide single crystal wafer can be quantitatively evaluated. In this case, a ratio of a number of the microscopic images having the defect dense part (number of images having the defect dense part) to a total number of the obtained microscopic images (total number of the images) is preferably calculated and digitalized. This enables to compare wafers. Based on the digitalized value, the silicon carbide single crystal wafer can also be evaluated. This evaluation may be, for example, acceptance determination, and a condition of growing the single crystal can be reconsidered.

Based on positional information of the microscopic images having the defect dense part and positional information of the microscopic images not having the defect dense part, an in-plane distribution of the crystal defects in the silicon carbide single crystal wafer can be evaluated. In this case, the in-plane distribution of the crystal defects can be visually evaluated by performing mapping from the positional information of the microscopic images to display the mapping on a monitor of the PC.

As described above in detail, the method for evaluating a silicon carbide single crystal wafer according to the present invention can observe many points in the wafer surface compared with a conventional manual observation, and enables to combine the mapping measurement and image analysis on the entire surface, which can easily grasp positions of the defect dense parts. In addition, a degree of the defect dense part can be digitalized and quantitatively evaluated. By further inspecting the defect dense part base on such results to improve the wafer manufacturing condition or by selecting the manufactured wafers, the silicon carbide single crystal wafer can be provided with a good degree of the defect dense part. As a result, the silicon carbide single crystal wafer with which a device can be manufactured with a good yield can be provided.

Example

Hereinafter, the present invention will be specifically described with Example, but this Example does not limit the present invention.

Example

Evaluation targets were silicon carbide single crystal wafers with 100 mm or 96 mm in diameter. These silicon carbide single crystal wafers were subjected to a selective etching treatment by using melted KOH melted at 500° C.; to reveal crystal defects (dislocation) as an etch pit so that a pit size due to a threading edge dislocation was approximately 30 μm. An entirety of this wafer was automatically photographed with 2-mm interval so that an observation size was 1 mm square by using the automatic inspecting apparatus illustrated in FIG. 6 with the imaging camera to control the electrically driven XY stage. In the wafer with 100 mm in diameter, 1789 microscopic images were automatically photographed, presence or absence of a defect dense part was determined when the etch pit had a continued length of 800 μm or longer was judged to have the defect dense part, and the microscopic images were classified. Mapping the microscopic images classified as above based on positional information yielded a map as FIG. 4. In FIG. 4, a cell indicated in black is the image having the defect dense part. As shown in FIG. 4, 73 images were judged to have the defect dense part, and a ratio of the images having the defect dense part was 73/1789=4.1%. On the wafer with 96 mm in diameter, 1741 microscopic images were automatically photographed by the similar method, and the etch pit having a continued length of 800 μm or longer was judged to have the defect dense part, resulting in a map as FIG. 5. As shown in FIG. 5, 23 images were judged to have the defect dense part, and a ratio of the images having the defect dense part was 23/1741=1.3. The mapping as above enabled to visualize the distribution of the defect dense part for easy grasp. The digitalization enabled to quantitatively the dense state of the defects.

Comparative Example

With the same wafer as in Example that was subjected to the selective etching with melted KOH, the wafer surface was visually observed with a microscope manually. The presence of the defect dense part was able to be confirmed, but it was difficult to precisely grasp the positions of the defect dense part and to perform quantitative evaluation with digitalization. The difference in the dense states of the defects between the two wafers was not obviously determined.

As above, Example of the present invention was able to easily evaluate the dense state of the defects regardless of operation skill of an operator.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for evaluating crystal defects in a silicon carbide single crystal wafer, the method comprising steps of:

etching a silicon carbide single crystal wafer with melted KOH so that a size of an etch pit due to a threading edge dislocation is 10 to 50 μm;

obtaining microscopic images by automatic photographing at a plurality of positions on a surface of the silicon carbide single crystal wafer after the etching;

determining presence or absence of a defect dense part in each of all the obtained microscopic images based on a continued length of the etch pit formed by the etching; and classifying all the obtained microscopic images into microscopic images having the defect dense part and microscopic images not having the defect dense part to evaluate a dense state of crystal defects in the silicon carbide single crystal wafer.

2. The method for evaluating crystal defects in a silicon carbide single crystal wafer according to claim 1, wherein the microscopic images are judged to have the defect dense part when an etch pit having a continued length of 500 μm or longer is observed.

3. The method for evaluating crystal defects in a silicon carbide single crystal wafer according to claim 1, wherein the dense state of the crystal defects in the silicon carbide single crystal wafer is evaluated based on a ratio of a number of the microscopic images having the defect dense part to a total number of the obtained microscopic images.

4. The method for evaluating crystal defects in a silicon carbide single crystal wafer according to claim 2, wherein the dense state of the crystal defects in the silicon carbide single crystal wafer is evaluated based on a ratio of a number of the microscopic images having the defect dense part to a total number of the obtained microscopic images.

5. The method for evaluating crystal defects in a silicon carbide single crystal wafer according to claim 1, wherein an in-plane distribution of the crystal defects in the silicon carbide single crystal wafer is evaluated based on positional information of the microscopic images having the defect dense part and positional information of the microscopic images not having the defect dense part.

6. The method for evaluating crystal defects in a silicon carbide single crystal wafer according to claim 2, wherein an in-plane distribution of the crystal defects in the silicon carbide single crystal wafer is evaluated based on positional information of the microscopic images having the defect dense part and positional information of the microscopic images not having the defect dense part.

7. The method for evaluating crystal defects in a silicon carbide single crystal wafer according to claim 3, wherein an in-plane distribution of the crystal defects in the silicon carbide single crystal wafer is evaluated based on positional information of the microscopic images having the defect dense part and positional information of the microscopic images not having the defect dense part.

8. The method for evaluating crystal defects in a silicon carbide single crystal wafer according to claim 4, wherein an in-plane distribution of the crystal defects in the silicon carbide single crystal wafer is evaluated based on positional information of the microscopic images having the defect dense part and positional information of the microscopic images not having the defect dense part.

9. The method for evaluating crystal defects in a silicon carbide single crystal wafer according to claim 1, wherein the crystal defects are micropipes, threading helical dislocations, threading edge dislocations, and basal plane dislocations.

10. The method for evaluating crystal defects in a silicon carbide single crystal wafer according to claim 2, wherein the crystal defects are micropipes, threading helical dislocations, threading edge dislocations, and basal plane dislocations.

11. The method for evaluating crystal defects in a silicon carbide single crystal wafer according to claim 3, wherein the crystal defects are micropipes, threading helical dislocations, threading edge dislocations, and basal plane dislocations.

12. The method for evaluating crystal defects in a silicon carbide single crystal wafer according to claim 4, wherein the crystal defects are micropipes, threading helical dislocations, threading edge dislocations, and basal plane dislocations.

13. The method for evaluating crystal defects in a silicon carbide single crystal wafer according to claim 5, wherein the crystal defects are micropipes, threading helical dislocations, threading edge dislocations, and basal plane dislocations.

14. The method for evaluating crystal defects in a silicon carbide single crystal wafer according to claim 6, wherein the crystal defects are micropipes, threading helical dislocations, threading edge dislocations, and basal plane dislocations.

15. The method for evaluating crystal defects in a silicon carbide single crystal wafer according to claim 7, wherein the crystal defects are micropipes, threading helical dislocations, threading edge dislocations, and basal plane dislocations.

16. The method for evaluating crystal defects in a silicon carbide single crystal wafer according to claim 8, wherein the crystal defects are micropipes, threading helical dislocations, threading edge dislocations, and basal plane dislocations.

17. The method for evaluating crystal defects in a silicon carbide single crystal wafer according to claim 1, wherein the microscopic images are obtained by the automatic photographing by using an automatic inspecting apparatus having at least an electrically-driven XY stage, a microscope, and an imaging camera, and the obtained microscopic images are subjected to image analysis to judge presence or absence of the defect dense part.

* * * * *